(12) United States Patent
Jang

(10) Patent No.: US 7,660,171 B2
(45) Date of Patent: Feb. 9, 2010

(54) SEMICONDUCTOR MEMORY DEVICE AND METHOD FOR DRIVING THE SAME

(75) Inventor: Ji-Eun Jang, Kyoungki-do (KR)

(73) Assignee: Hynix Semiconductor Inc., Kyoungki-Do (KR)

( * ) Notice: Subject to any disclaimer, the term of this patent is extended or adjusted under 35 U.S.C. 154(b) by 100 days.

(21) Appl. No.: 11/823,878

(22) Filed: Jun. 29, 2007

(65) Prior Publication Data

US 2008/0080272 A1 Apr. 3, 2008

(30) Foreign Application Priority Data

Sep. 28, 2006 (KR) ............... 10-2006-0095188

(51) Int. Cl.
*G11C 7/00* (2006.01)
(52) U.S. Cl. ............... 365/194; 365/236; 365/189.07; 365/191; 365/233.1; 365/233.11
(58) Field of Classification Search ............... 365/194, 365/236, 189.07, 191, 233.1, 233.11
See application file for complete search history.

(56) References Cited

U.S. PATENT DOCUMENTS

| 6,446,180 | B2 | 9/2002 | Li et al. | |
|---|---|---|---|---|
| 6,724,228 | B2 * | 4/2004 | Kashiwazaki | ............... 327/158 |
| 6,977,848 | B2 | 12/2005 | Choi | |
| 6,982,924 | B2 | 1/2006 | Na | |
| 6,987,705 | B2 | 1/2006 | Kim et al. | |
| 7,027,336 | B2 | 4/2006 | Lee | |
| 7,081,784 | B2 | 7/2006 | Kang | |
| 7,257,183 | B2 | 8/2007 | Dally et al. | |
| 2004/0008064 | A1 * | 1/2004 | Kashiwazaki | ............... 327/158 |
| 2004/0208270 | A1 | 10/2004 | Schmatz et al. | |
| 2005/0185500 | A1 * | 8/2005 | Park | ............... 365/233 |
| 2005/0262373 | A1 * | 11/2005 | Kim | ............... 713/401 |
| 2006/0203577 | A1 * | 9/2006 | Lee | ............... 365/194 |
| 2007/0036020 | A1 | 2/2007 | Lee et al. | |

FOREIGN PATENT DOCUMENTS

| JP | 2004-327008 | 11/2004 |
|---|---|---|
| KR | 1999-0075064 | 10/1999 |
| KR | 2000-0002777 | 1/2000 |
| KR | 2001-0064123 | 7/2001 |
| KR | 10-2006-0062426 | 6/2006 |
| KR | 1020070026079 | 3/2007 |

* cited by examiner

*Primary Examiner*—Thong Q Le
(74) *Attorney, Agent, or Firm*—Blakely, Sokoloff, Taylor & Zafman LLP

(57) ABSTRACT

A semiconductor memory device includes: a first count unit for counting a delayed locked loop (DLL) clock in response to a clock enable signal; a first delay unit for delaying the clock enable signal for a delay time which corresponds to a delay amount of a delay model included in a DLL circuit; a second count unit for counting an external clock in response to the delayed clock enable signal; a comparison unit for comparing an output of the first count unit with an output of the second count unit in order to generate a latency signal; and an output enable signal generation unit for generating an output enable signal by using the latency signal.

15 Claims, 7 Drawing Sheets

SEMICONDUCTOR MEMORY DEVICE AND METHOD FOR DRIVING THE SAME

CROSS-REFERENCE TO RELATED APPLICATIONS

The present invention claims priority of Korean patent application number 10-2006-0095188, filed on Sep. 28, 2006, which is incorporated by reference in its entirety.

BACKGROUND OF THE INVENTION

The present invention relates to a semiconductor design technology, and more particularly, to an output enable signal generator for use in a semiconductor memory device.

An output enable signal generator included in a synchronous dynamic random access memory (SDRAM) is used in order to output a data satisfying a corresponding CAS latency (CL) in response to a read command.

FIG. 1 is a block diagram depicting a conventional output enable signal generator.

As shown, the conventional output enable signal generator includes a delayed locked loop (DLL) clock count unit 10 for counting a DLL clock RCLKDLL in response to a clock enable signal CKE, an external clock count unit 11 for counting an external clock EXTCLK, a comparison unit 12 for comparing an output of the DLL clock count unit 10 with an output of the external clock count unit 11 in response to a read command RD, and an output enable signal generation unit 13 for generating an output enable signal OUTEN by using a latency signal LATENCY output from the comparison unit 12.

Further, the conventional output enable signal generator includes a count control unit 14 for enabling and disabling the DLL clock count unit 10 and the external clock count unit 11 in response to an output enable signal reset signal OERESET.

Herein, the comparison unit 12 and the output enable signal generation unit 13 are synchronized with the DLL clock RCLKDLL.

FIG. 2 is a block diagram illustrating the conventional output enable signal generator shown in FIG. 1 in detail.

As shown, the DLL count unit 10 includes an initialization unit 20, a signal generation unit 21 and a DLL clock count circuit 22.

The signal generation unit 21 serves to generate a DLL clock enable signal RCLKDLLCKE which corresponds to the clock enable signal CKE. That is, the signal generation unit 21 generates the DLL clock enable signal RCLKDLLCKE in response to the DLL clock RCLKDLL and the clock enable signal CKE.

In detail, the signal generation unit 21 includes a first D flip-flop DFF1 for transferring the clock enable signal CKE by receiving the DLL clock RCLKDLL as a control signal and a first AND gate AND1 for receiving an output signal CKEDLL of the first D flip-flop DFF1 and the DLL clock RCLKDLL in order to generate the DLL clock enable signal RCLKDLLCKE which corresponds to the clock enable signal CKE.

The initialization unit 20 serves to initialize the DLL clock count circuit 22. The initialization unit 20 receives a CAS latency CL<5:11> and calculates a formula '16-(CL-3)' using a value of the received CAS latency in order to set the DLL clock count circuit 22. Herein, the CAS latency CL<5:11> is set by a mode register set (MRS). Further, '16' of the formula '16-(CL-3)' is due to a 16-bit system of the DLL clock count circuit 22, and '3' is for securing a cross margin between the external clock EXTCLK and the DLL clock RCLKDLL.

The DLL clock count circuit 22 is set by the initialization unit 20 and serves to count the DLL clock enable signal RCLKDLLCKE.

The external clock count unit 11 includes a signal generation unit 31 and an external clock count circuit 32.

The signal generation unit 31 serves to generate an external clock enable signal EXTCLKCKE which corresponds to the clock enable signal CKE. In response to the external clock EXTCLK and the clock enable signal CKE, the signal generation unit 31 generates the external clock enable signal EXTCLKCKE.

In detail, the signal generation unit 31 includes a second D flip-flop DFF2 for transferring the clock enable signal CKE by receiving the external clock EXTCLK as a control signal, and a second AND gate AND2 for receiving an output signal CKEEXT of the second D flip-flop DFF2 and the external clock EXTCLK in order to generate the external clock enable signal EXTCLKCKE which corresponds to the clock enable signal CKE.

The external clock count circuit 32 serves to count the external clock enable signal EXTCLKCKE.

The comparison unit 12 stores an external clock count signal group EXTCNT<3:0> output from the external clock count circuit 32 in response to a read command RD and compares the stored signal group with a DLL clock count signal group DLLCNT<3:0> output from the DLL clock count circuit 22. When the external clock count signal group EXTCNT<3:0> has the same value as that of the DLL clock count signal group DLLCNT<3:0>, the comparison unit 12 outputs the latency signal LATENCY.

The output enable signal generation unit 13 includes a delay circuit 41 for delaying the latency signal LATENCY output from the comparison unit 12 and a signal generation unit 42 for generating the output enable signal OUTEN in response to an output of the delay circuit 41.

Herein, the delay circuit 41 has a delay amount for securing an output margin of the latency signal LATENCY which is delayed for an internal delay amount before it is outputted as the output enable signal OUTEN.

The count control unit 14 includes a third D flip-flop DFF3 for transferring the output enable reset signal OERESET by receiving the DLL clock RCLKDLL as a control signal, a delay unit 51 for delaying an output signal of the third D flip-flop DFF3 for a predetermined delay amount tDLL, and a fourth D flip-flop for transferring an output signal of the delay unit 51 by receiving the external clock EXTCLK as a control signal.

FIGS. 3A and 3B are timing diagrams showing an operation of the conventional output enable signal generator shown in FIGS. 1 and 2.

Referring to FIG. 3A, a semiconductor memory device is normally operated as follows. The external clock count circuit 32 begins to perform a count operation in response to an inactivation of a delayed output enable reset signal OERESETEXT generated by delaying the output enable reset signal OERESET for the DLL time tDLL, i.e., the delay amount of a delay model of a DLL. At this time, the DLL clock count circuit 22 is performing a count operation by the initialization unit 20.

Thereafter, the read command RD is inputted and an external clock count value (3) is stored. When a DLL clock count value (3) equals the external clock count value (3), the comparison unit 12 outputs the latency signal LATENCY.

By using the latency signal LATENCY, the output enable signal OUTEN is generated, and read data D0 to D7 are outputted in response to the output enable signal OUTEN.

However, according to the operation of the conventional output enable signal generator, the DLL clock count circuit 22 and the external clock count circuit 32 need not be operating in an active power down mode. In the active power down mode, a column enable transistor YI, which serves to connect a bit line to a segment input/output line (SIO), is not operated when a word line and a bit line are enabled.

That is, by stopping operations of the DLL clock count circuit 22 and the external clock count circuit 32, power consumption can be reduced.

However, in accordance with the conventional output enable signal generator, when the operations of the DLL clock count circuit 22 and the external clock count circuit 32 are stopped in the active power down mode, a problem occurs as follows.

FIG. 3B shows an abnormal operation of the conventional output enable signal generator when the DLL clock count circuit 22 and the external clock count circuit 32 are disabled during the active power down mode.

As shown, when the semiconductor memory device enters the active power down mode, an internal clock enable signal INTERNALCKE is activated. Further, the operations of the DLL clock count circuit 22 and the external clock count circuit 32 are stopped during an inactive period of the internal clock enable signal.

That is, during the inactive period of the internal clock enable signal, by stopping the toggling of the external clock enable signal EXTCLKCKE and the DLL clock enable signal RCLKDLLCKE, the operations of the DLL clock count circuit 22 and the external clock count circuit 32 are stopped.

However, if the DLL clock count signal DLLCNT is inactivated, activation timing of the DLL clock RCLKDLL becomes different from that of the normal operation mode in terms of frequency. This means that an enabling timing of the DLL clock count unit 10 is changed.

Although data is transferred in the semiconductor memory device in synchronization with the DLL clock RCLKDLL, which is an internal clock, before the data is output from the semiconductor memory device, the data is finally transferred to the outside in synchronization with the external clock EXTCLK. Therefore, the DLL clock should lead the external clock EXTCLK.

As shown in FIG. 3B, since the external clock EXTCLK and the DLL clock RCLKDLL begin to toggle almost at the same time in response to an activation of the internal clock enable signal INTERNALCKE, if the read command RD is inputted after completing the active power down mode, output data DQ, which are output, are delayed by one clock relative to the expected CL.

SUMMARY OF THE INVENTION

Embodiments of the present invention are directed to provide an output enable signal generator for reducing power consumption by disabling a counter included in the output enable signal generator, during an active power down mode, without causing abnormal operation due to the disablement of the counter.

In accordance with an aspect of the present invention, there is provided a semiconductor memory device, including: a first count unit for counting a delayed locked loop (DLL) clock in response to a clock enable signal; a first delay unit for delaying the clock enable signal for a delay time which corresponds to a delay amount of a delay model included in a DLL circuit; a second count unit for counting an external clock in response to the delayed clock enable signal; a comparison unit for comparing an output of the first count unit with an output of the second count unit to generate a latency signal; and an output enable signal generation unit for generating an output enable signal by using the latency signal.

In accordance with another aspect of the present invention, there is provided a method for operating a semiconductor memory device, including: counting a delayed locked loop (DLL) clock in response to a clock enable signal; delaying the clock enable signal for a delay time which corresponds to a delay amount of a delay model included in a DLL circuit; counting an external clock in response to the delayed clock enable signal; comparing the counted value of the DLL clock with the counted value of the external clock; and generating an output enable signal by using a latency signal generated according to the comparison result of the step of comparing.

DESCRIPTION OF SPECIFIC EMBODIMENTS

An embodiment of the invention is an output enable signal generator for reducing power consumption by disabling a counter included in the output enable signal generator, during an active power down mode, without causing abnormal operation due to the disablement of the counter. Therefore, in accordance with the present invention, power consumption of a semiconductor memory device can be reduced and, thus, a production yield of a semiconductor memory device can be increased.

Hereinafter, an output enable signal generator in accordance with the present invention will be described in detail referring to the accompanying drawings.

Figure 1:
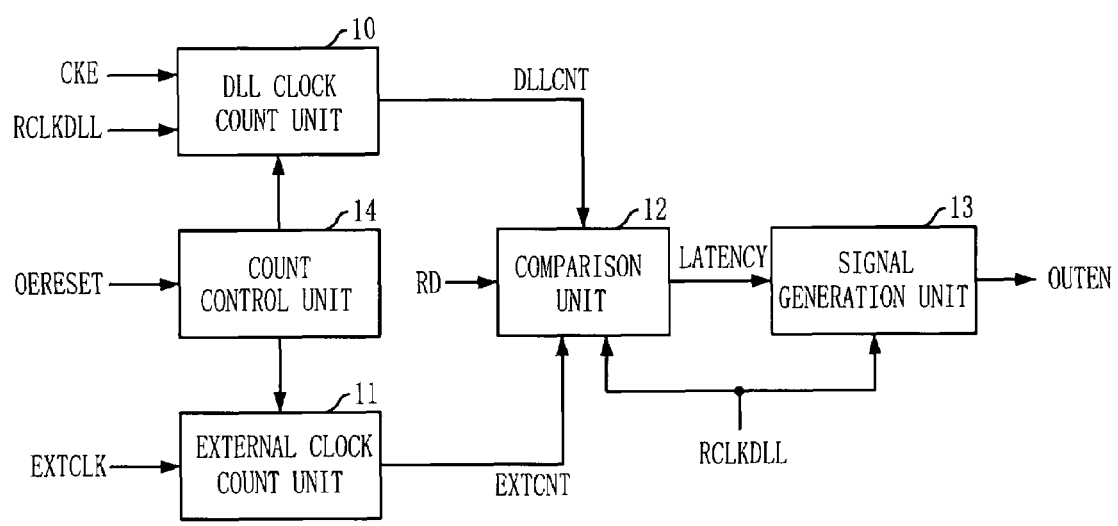
FIG. 1 is a block diagram depicting a conventional output enable signal generator.
Figure 2:
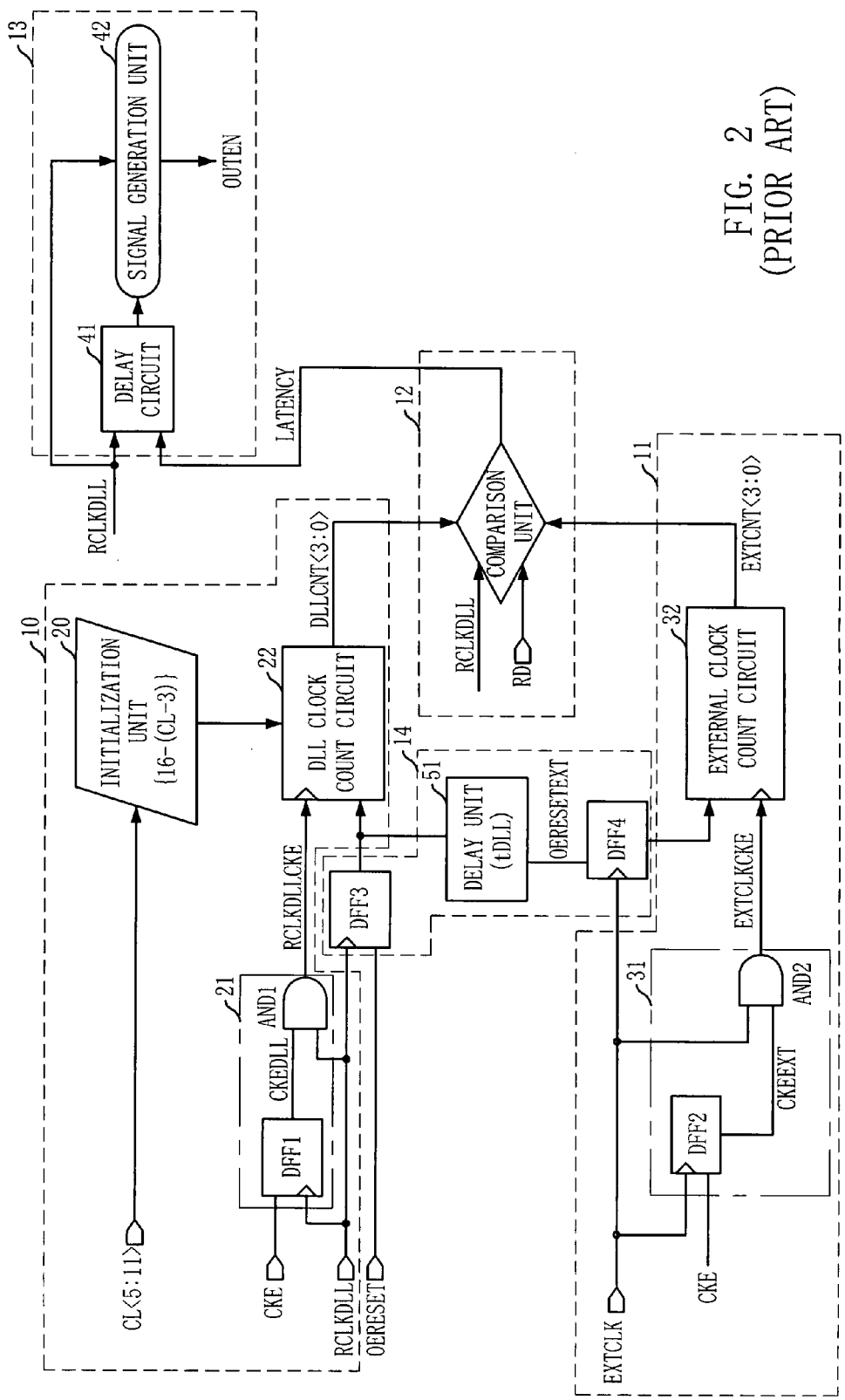
FIG. 2 is a block diagram illustrating the conventional output enable signal generator shown in FIG. 1 in detail.
Figure 3A:
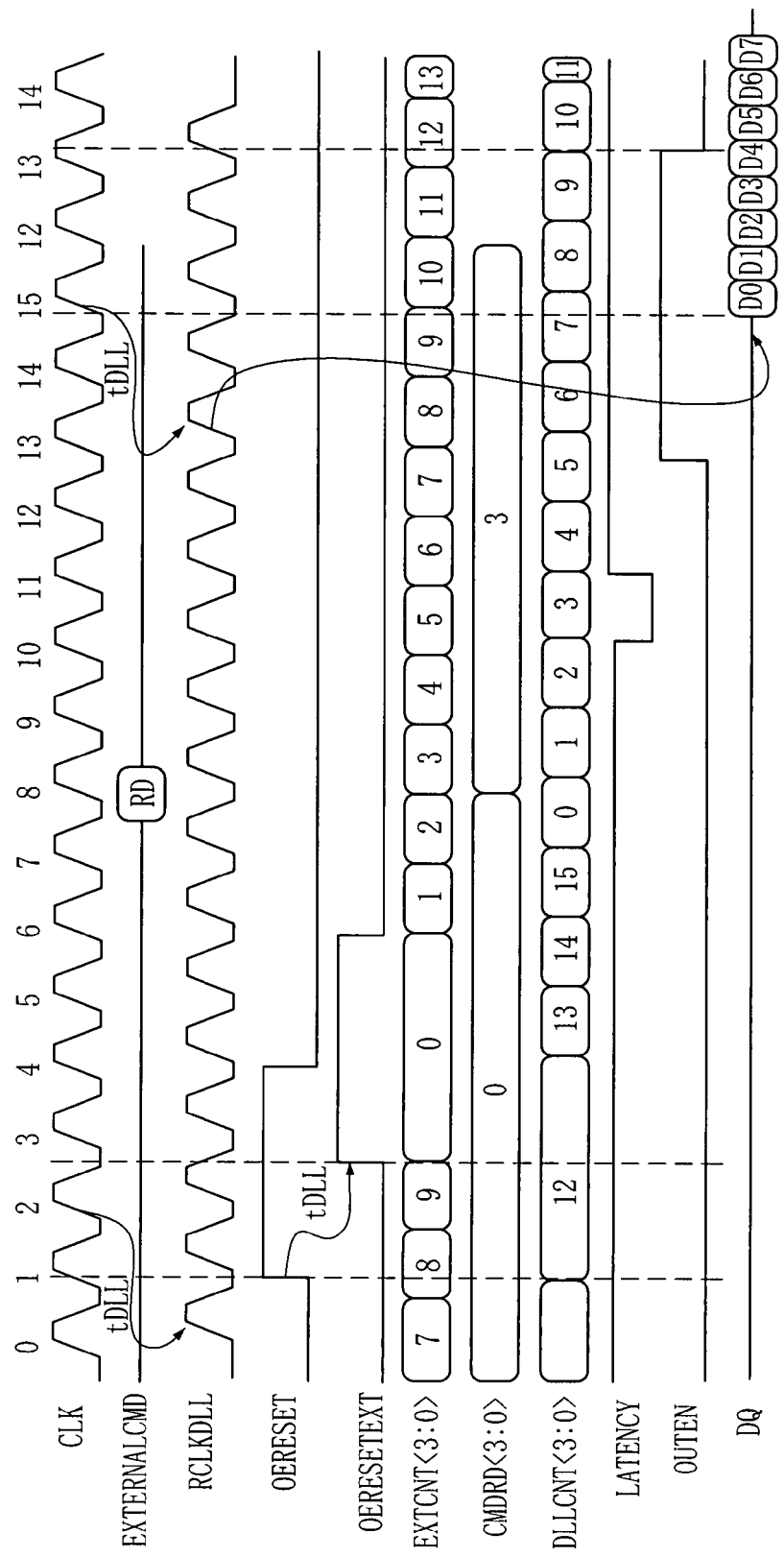
FIGS. 3A and 3B are timing diagrams showing an operation of the conventional output enable signal generator shown in FIGS. 1 and 2.
Figure 3B:
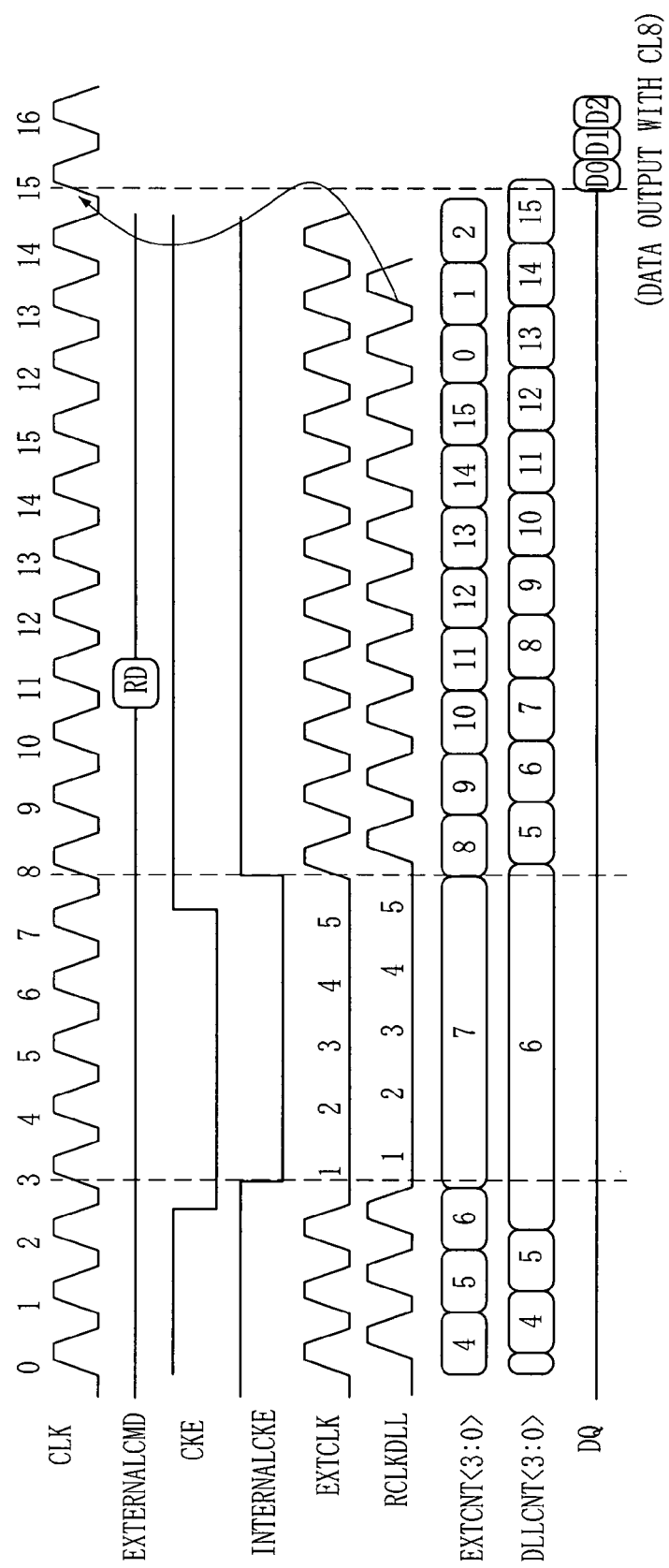
Figure 4:
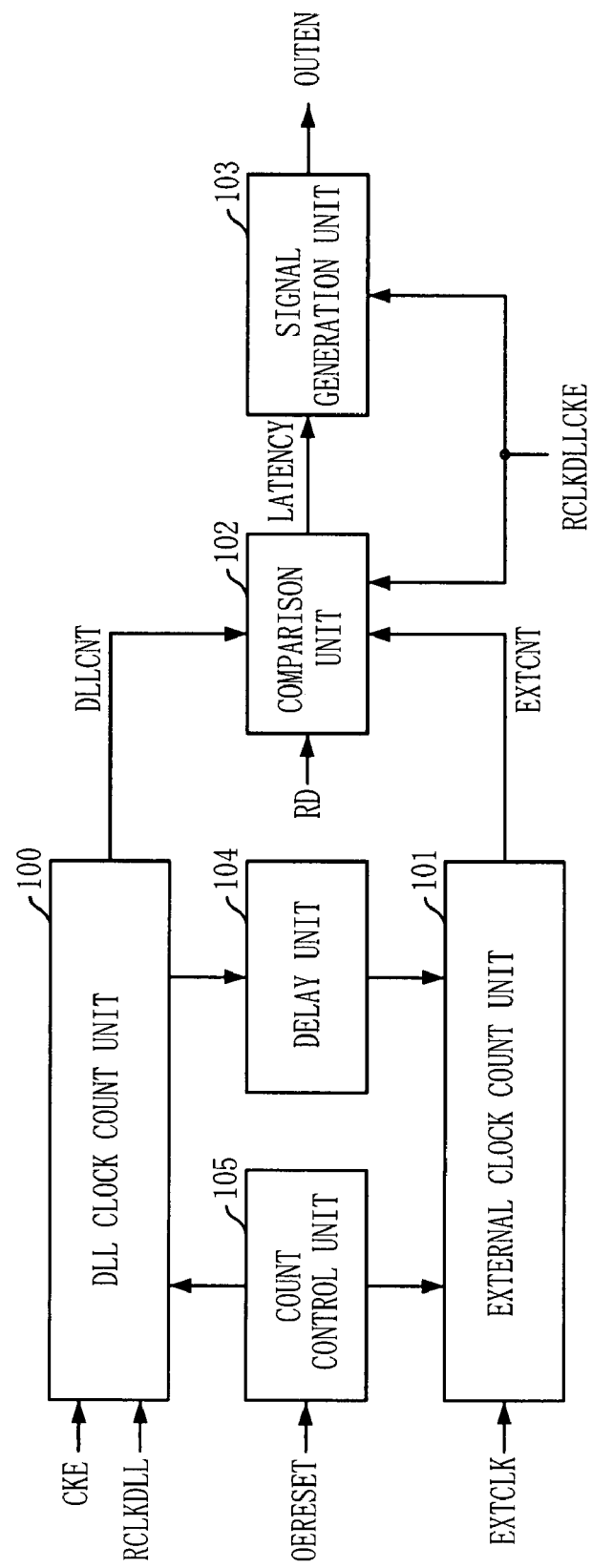
FIG. 4 is a block diagram depicting an output enable signal generator for use in a semiconductor memory device in accordance with a preferred embodiment of the present invention.

FIG. 4 is a block diagram depicting an output enable signal generator for use in a semiconductor memory device in accordance with a preferred embodiment of the present invention.

As shown, the output enable signal generator includes a DLL clock count unit 100 for counting a DLL clock RCLKDLL in response to a clock enable signal CKE, an external clock count unit 101 for counting an external clock EXTCLK, a comparison unit 102 for comparing an output of the DLL clock count unit 100 with an output of the external clock count unit 101 in response to a read command RD, an output enable signal generation unit 103 for generating an output enable signal OUTEN by using a latency signal LATENCY output from the comparison unit 102, and a delay unit 104 for delaying the clock enable signal CKE for a delay time tDLL which corresponds to a delay amount of a delay model of a DLL.

Further, the output enable signal generator includes a count control unit 105 for enabling and disabling the DLL clock count unit 100 and the external clock count unit 101 in response to an output enable signal reset signal OERESET.

Herein, the comparison unit 102 and the output enable signal generation unit 103 are synchronized with the DLL clock RCLKDLL.

Figure 5:
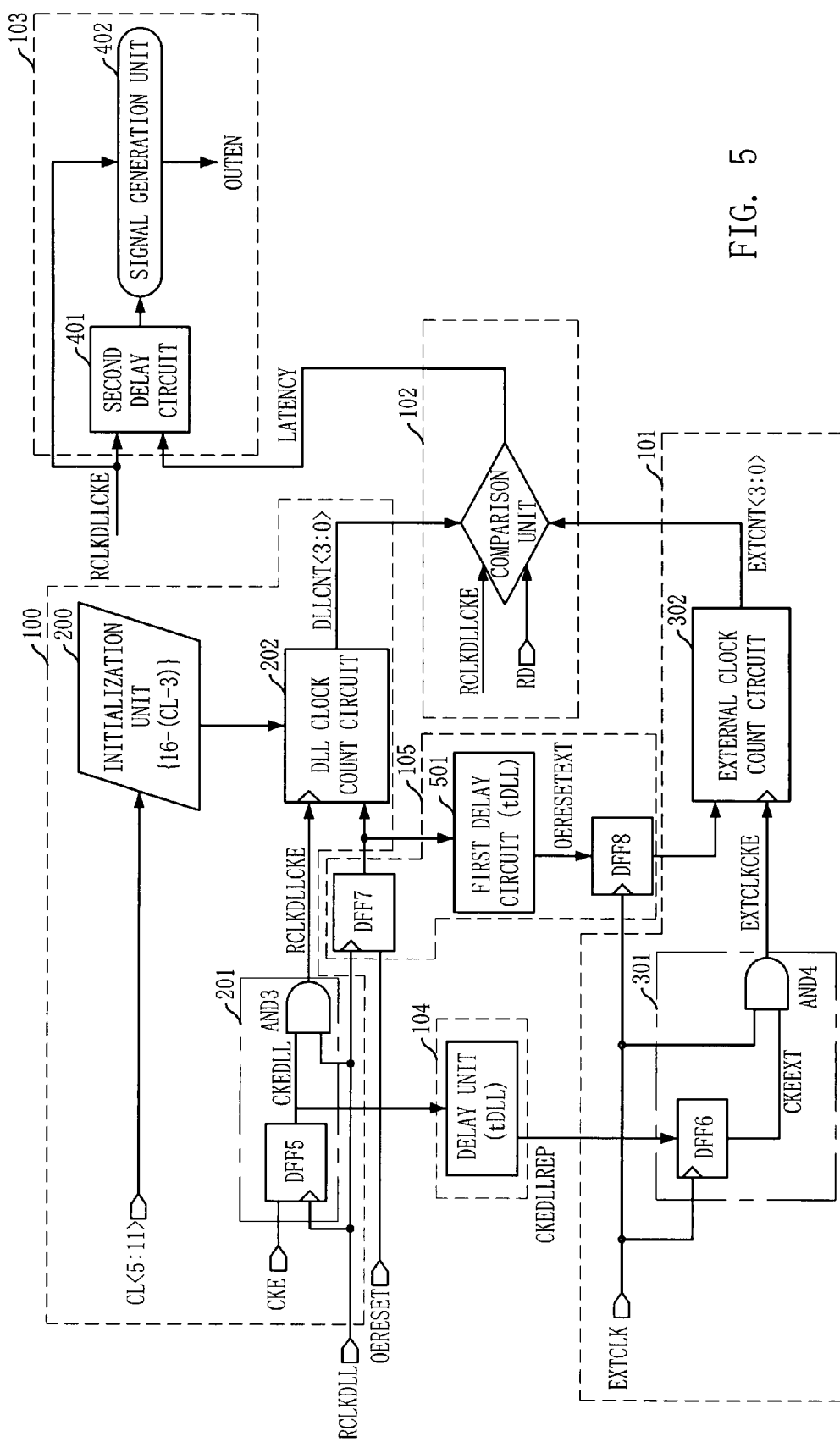
FIG. 5 is a block diagram illustrating the output enable signal generator shown in FIG. 4 in detail.

FIG. 5 is a block diagram illustrating the output enable signal generator shown in FIG. 4 in detail.

As shown, the DLL clock count unit 100 includes an initialization unit 200, a signal generation unit 201 and a DLL clock count circuit 202.

The signal generation unit 201 serves to generate a DLL clock enable signal RCLKDLLCKE which corresponds to the clock enable signal CKE. That is, the signal generation unit 201 generates the DLL clock enable signal RCLKDLLCKE in response to the DLL clock RCLKDLL and the clock enable signal CKE.

In detail, the signal generation unit 201 includes a first D flip-flop DFF5 for transferring the clock enable signal CKE by receiving the DLL clock RCLKDLL as a control signal, and a first AND gate AND3 for receiving an output signal CKEDLL of the first D flip-flop DFF3 and the DLL clock RCLKDLL in order to generate the DLL clock enable signal RCLKDLLCKE which corresponds to the clock enable signal CKE.

The initialization unit 200 serves to initialize the DLL clock count circuit 202. The initialization unit 200 receives a CAS latency CL<5:11> and calculates a formula '16-(CL-3)' using a value of the received CAS latency in order to set the DLL clock count circuit 202. Herein, the CAS latency CL<5:11> is set by a mode register set (MRS). Further, '16' of the formula '16-(CL-3)' is due to a 16-bit system of the DLL clock count circuit 202, and '3' is for securing a cross margin between the external clock EXTCLK and the DLL clock RCLKDLL.

The DLL clock count circuit 202 is set by the initialization unit 200 and serves to count the DLL clock enable signal RCLKDLLCKE.

The external clock count unit 101 includes a signal generation unit 301 and an external clock count circuit 302.

The signal generation unit 301 serves to generate an external clock enable signal EXTCLKCKE which corresponds to the clock enable signal CKE. In detail, in response to the external clock EXTCLK and a signal CKEDLLREP outputted from the delay unit 104, the signal generation unit 301 generates the external clock enable signal EXTCLKCKE.

In detail, the signal generation unit 301 includes a second D flip-flop DFF6 for transferring the clock enable signal CKE by receiving the external clock EXTCLK as a control signal, and a second AND gate AND4 for receiving an output signal CKEEXT of the second D flip-flop DFF6 and the external clock EXTCLK in order to generate the external clock enable signal EXTCLKCKE which corresponds to the clock enable signal CKE.

The external clock count circuit 302 serves to count the external clock enable signal EXTCLKCKE.

The comparison unit 102 stores an external clock count signal group EXTCNT<3:0> output from the external clock count circuit 302 in response to the read command RD and compares the stored signal group with a DLL clock count signal group DLLCNT<3:0> output from the DLL clock count circuit 202. When the external clock count signal group EXTCNT<3:0> has the same value as that of the DLL clock count signal group DLLCNT<3:0>, the comparison unit 102 outputs the latency signal LATENCY.

The output enable signal generation unit 103 includes a second delay circuit 401 for delaying the latency signal LATENCY output from the comparison unit 102, and a signal generation unit 402 for generating the output enable signal OUTEN in response to an output of the second delay circuit 401.

Herein, the second delay circuit 401 has a delay amount for securing an output margin of the latency signal LATENCY delayed for an internal delay amount before the latency signal LATENCY is output as the output enable signal OUTEN.

The count control unit 105 includes a first synchronization unit for generating a first count control signal by synchronizing the output enable reset signal OERESET with the DLL clock RCLKDLL in order to control a count operation of the DLL clock count unit 100, a first delay circuit 501 for delaying the first count control signal for the delay time tDLL which corresponds to the delay model of the DLL, and a second synchronization unit for generating a second count control signal by synchronizing an output signal of the first delay circuit 501 with the external clock EXTCLK in order to control a count operation of the external clock count unit 101.

That is, the first synchronization unit includes a third D flip-flop DFF7 for transferring the output enable reset signal OERESET by receiving the DLL clock RCLKDLL as a control signal. The first delay circuit 501 delays the output signal of the third D flip-flop DFF7 for the delay time tDLL. The second synchronization unit includes a fourth D flip-flop DFF8 for transferring the output signal of the first delay circuit 501 by receiving the external clock EXTCLK as a control signal.

The delay unit 104 is a delay replica device for delaying the output signal CKEDLL of the first D flip-flop DFF5 for the delay time tDLL which corresponds to the delay model of the DLL and for transferring the delayed signal to the second D flip-flop DFF6.

Figure 6:
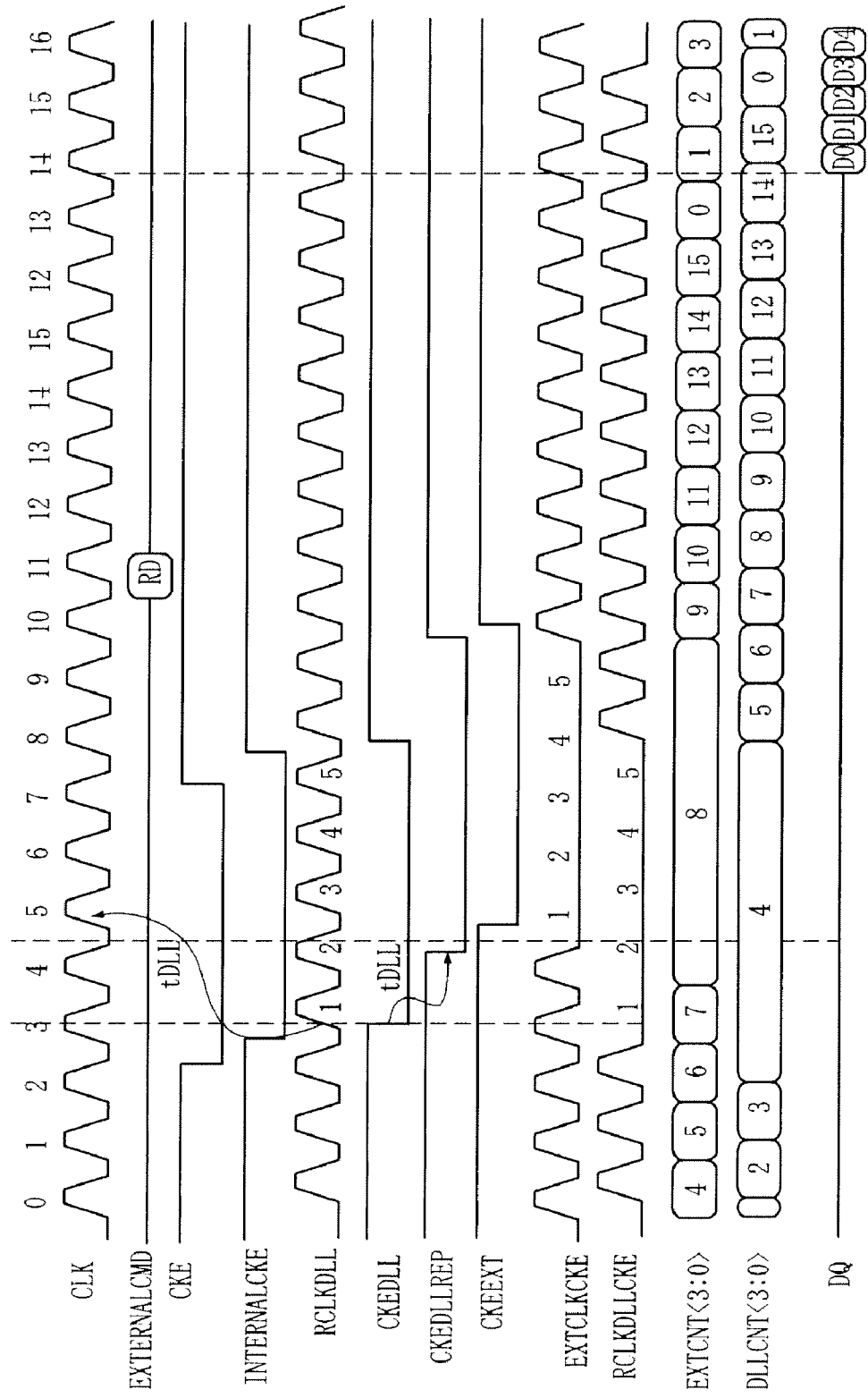
FIG. 6 is a timing diagram depicting an operation of the output enable signal generator shown in FIGS. 4 and 5.

FIG. 6 is a timing diagram depicting an operation of the output enable signal generator shown in FIGS. 4 and 5.

Referring to FIG. 6, during normal operation, i.e., when the clock enable signal CKE is activated, the external clock count circuit 302 begins to perform a count operation in response to an inactivation of a delayed output enable reset signal OERESETEXT generated by delaying the output enable reset signal OERESET for the DLL time tDLL, i.e., the delay amount of the delay model of the DLL. At this time, the DLL clock count circuit 202 is performing a count operation by the initialization unit 200.

Thereafter, the read command RD is inputted and an external clock count value (3) is stored. When a DLL clock count value (3) equals the external clock count value (3), the comparison unit 102 outputs the latency signal LATENCY.

By using the latency signal LATENCY, the output enable signal OUTEN is generated, and a read data D0 to D7 is outputted in response to the output enable signal OUTEN.

During power down mode when the clock enable signal CKE is inactivated, the external clock enable signal EXTCLKCKE and the DLL clock enable signal RCLKDLLCKE stop toggling, in response to the inactivation of the clock enable signal CKE.

Herein, in comparison with the conventional output enable signal generator, the period during which the toggling of the DLL clock enable signal RCLKDLLCKE has stopped, is started earlier and is finished earlier than that of the external clock enable signal EXTCLKCKE. This is due to the delay unit 104. That is, the toggling stop period of the DLL clock enable signal RCLKDLLCKE is started earlier and is finished earlier than that of the external clock enable signal EXTCLKCKE by the DLL time tDLL.

Accordingly, a period during which count operation of the DLL clock count circuit 202 is stopped, is started earlier and is finished earlier than that of the external clock count circuit 302.

As mentioned above, according to the conventional output enable signal generator, the count operation stop period of the DLL clock count circuit is the same as that of the external clock count circuit and, thus, data cannot be outputted while satisfying the desired CAS latency.

For solving the above-mentioned problem, the count operation stop period of the DLL clock count circuit 202 is started earlier and is finished earlier than that of the external clock count circuit 302, by the DLL time tDLL. Accordingly, data can be outputted while satisfying the desired CAS latency.

Further, it is desirable that the DLL time tDLL correspond to the delay amount of the delay model of the DLL. That is, in general, the DLL clock RCLKDLL leads the external clock EXTCLK by the DLL time tDLL. Therefore, the count operation stop period of the DLL clock count circuit 202 is earlier than that of the external clock count circuit 302.

While the present invention has been described with respect to the specific embodiments, it will be apparent to those skilled in the art that various changes and modifications may be made without departing from the spirit and scope of the invention as defined in the following claims.

What is claimed is:

1. A semiconductor memory device, comprising:
    a first count unit for counting a delayed locked loop (DLL) clock in response to a clock enable signal;
    a first delay unit for delaying the clock enable signal for a delay time which corresponds to a delay amount of a delay model included in a DLL circuit;
    a second count unit for counting an external clock in response to the delayed clock enable signal;
    a comparison unit for comparing an output of the first count unit with an output of the second count unit in order to generate a latency signal; and
    an output enable signal generation unit for generating an output enable signal by using the latency signal.

2. The semiconductor memory device as recited in claim 1, further comprising a count control unit for enabling and disabling the first and second count units in response to an output enable reset signal.

3. The semiconductor memory device as recited in claim 2, wherein the count control unit includes:
    a first synchronization unit for generating a first count control signal by synchronizing the output enable reset signal with the DLL clock in order to control the count operation of the first count unit;
    a second delay unit for delaying the first count control signal for the delay time; and
    a second synchronization unit for generating a second count control signal by synchronizing an output of the second delay unit with the external clock in order to control the count operation of the second count unit.

4. The semiconductor memory device as recited in claim 3, wherein the first synchronization unit includes a D flip-flop for transferring the output enable reset signal by receiving the DLL clock as a control signal.

5. The semiconductor memory device as recited in claim 3, wherein the second synchronization unit includes a D flip-flop for transferring the output signal of the second delay unit by receiving the external clock as a control signal.

6. The semiconductor memory device as recited in claim 3, wherein the first count unit includes:
    a first signal generation unit for receiving the DLL clock and the clock enable signal in order to generate a DLL clock enable signal corresponding to the clock enable signal;
    a first counter for counting the DLL clock enable signal in response to the first count control signal; and
    an initialization unit for initializing the first counter.

7. The semiconductor memory device as recited in claim 6, wherein the signal generation unit includes:
    a first D flip-flop for transferring the clock enable signal by receiving the DLL clock as a control signal; and
    a first AND gate for receiving an output signal of the first D flip-flop and the DLL clock to generate the DLL clock enable signal corresponding to the clock enable signal.

8. The semiconductor memory device as recited in claim 7, wherein the second count unit includes:
    a second signal generation unit for receiving the external clock and the clock enable signal to generate an external clock enable signal corresponding to the clock enable signal; and
    a second counter for counting the external clock enable signal in response to the second count control signal.

9. The semiconductor memory device as recited in claim 8, wherein the signal generation unit includes:
    a second D flip-flop for transferring the clock enable signal by receiving the external clock as a control signal; and
    a second AND gate for receiving an output signal of the second D flip-flop and the external clock to generate the external clock enable signal corresponding to the clock enable signal.

10. The semiconductor memory device as recited in claim 9, wherein a toggling stop period of the DLL clock enable signal is started earlier and finished earlier than that of the external clock enable signal by the delay time.

11. The semiconductor memory device as recited in claim 9, wherein the first delay unit includes a delay replica device for delaying the output signal of the first D flip-flop for the delay time, and transferring the delayed signal to the second D flip-flop.

12. The semiconductor memory device as recited in claim 1, wherein the output enable signal generation unit includes:
    a delay circuit for delaying the latency signal output from the comparison unit; and
    a signal generation unit for generating the output enable signal in response to an output of the delay circuit.

13. The method for operating a semiconductor memory device, comprising:
    counting a delayed locked loop (DLL) clock in response to a clock enable signal;
    delaying the clock enable signal for a delay time which corresponds to a delay amount of a delay model included in a DLL circuit;
    counting an external clock in response to the delayed clock enable signal;
    comparing a counted value of the DLL clock with a counted value of the external clock; and
    generating an output enable signal by using a latency signal generated according to the comparison result of said comparison.

14. The method for operating the semiconductor memory device as recited in claim 13, wherein the counting the DLL clock is started in response to an activation of the clock enable signal and is finished in response to an inactivation of the clock enable signal.

15. The method for operating the semiconductor memory device as recited in claim 13, wherein the step of counting the external clock is started in response to an activation of the delayed clock enable signal and is finished in response to an inactivation of the delayed clock enable signal.

* * * * *